United States Patent
Kasama et al.

(10) Patent No.: US 7,491,613 B2
(45) Date of Patent: Feb. 17, 2009

(54) LINE ELEMENT AND METHOD OF MANUFACTURING THE LINE ELEMENT

(75) Inventors: Yasuhiko Kasama, Sendai (JP); Satoshi Fujimoto, Sendai (JP); Kenji Omote, Sendai (JP)

(73) Assignee: Ideal Star Inc., Sendai-Shi (JP)

( * ) Notice: Subject to any disclaimer, the term of this patent is extended or adjusted under 35 U.S.C. 154(b) by 351 days.

(21) Appl. No.: 10/513,145

(22) PCT Filed: May 2, 2003

(86) PCT No.: PCT/JP03/05620

§ 371 (c)(1),
(2), (4) Date: May 19, 2005

(87) PCT Pub. No.: WO03/094237

PCT Pub. Date: Nov. 13, 2003

(65) Prior Publication Data

US 2005/0253134 A1   Nov. 17, 2005

(30) Foreign Application Priority Data

May 2, 2002   (JP) .............................. 2002-131011

(51) Int. Cl.
*H01L 21/336* (2006.01)

(52) U.S. Cl. ...................................... 438/290; 438/293
(58) Field of Classification Search .................. 438/82, 438/99, 272, 290, 293, 780, 781
See application file for complete search history.

(56) References Cited

U.S. PATENT DOCUMENTS 4,913,744 A    4/1990   Hoegl
6,437,422 B1 *  8/2002  Solomon et al. ............ 257/618

FOREIGN PATENT DOCUMENTS

| JP | 11-195808   | 7/1999  |
|----|-------------|---------|
| JP | 2000-31006  | 1/2000  |
| JP | 2000-340785 | 12/2000 |
| JP | 10-256579   | 1/2004  |
| WO | WO 00/51186 | 8/2000  |

* cited by examiner

*Primary Examiner*—Thien F Tran
(74) *Attorney, Agent, or Firm*—Young & Thompson

(57) ABSTRACT

An element capable of manufacturing various devices of any shape having plasticity or flexibility without being limited by shape and a method for manufacturing thereof are provided. An element characterized by that a circuit element is formed continuously or intermittently in the longitudinal direction. An element characterized by that a cross section having a plurality of areas forming a circuit is formed continuously or intermittently in the longitudinal direction.

10 Claims, 20 Drawing Sheets

When sliced (a)

(b)

(a)

(b)

(c)

<As a tube>
Oxide film may be used in gate.

Photo power element (a)

Extrusion (b)

(a)

(b)

(c)

Manufacture example)

① Source wiring preparation

② Semiconductor layer formation 1

Coating semiconductor on silver line with dip

③ Gate electrode formation

④ Semiconductor layer formation

⑤ Drain electrode formation

LINE ELEMENT AND METHOD OF MANUFACTURING THE LINE ELEMENT

FIELD OF THE INVENTION

The present invention relates to a line element and a method of manufacturing the line element.

BACKGROUND ART

Nowadays, various types of devices using integrated circuits have prevailed in a wide range, and efforts are being made for further high integration and densification. One of those efforts is a three-dimensional integration technique.

Any of those devices, however, has a basic constitution of rigid boards such as wafers. Due to such a basic constitution with the rigid boards, its manufacturing method is restrained, and a degree of integration has a limitation. Moreover, the shape of devices is limited.

Also, electrically conductive fibers in which the surface of cotton or silk is plated or surrounded by an electrically conductive material such as gold or copper are known.

However, such a technique that a circuit element is formed in a single filament is not known. Also, even though it is an electrically conductive fiber, the filament itself is basically constituted with cotton or silk, and the filament itself is provided at its center.

The present invention has an object to provide a line element which is not limited by the shape but has plasticity or flexibility and is capable of forming various devices in an optional shape and its manufacturing method.

DESCRIPTION OF THE INVENTION

The present invention is a line element characterized by that a circuit element is formed continuously or intermittently in the longitudinal direction.

Also, a line element characterized by that a cross section having a plurality of areas forming a circuit is formed continuously or intermittently in the longitudinal direction.

Also the present invention is a method for manufacturing a line element characterized by that a material which forms an area forming a circuit element is melted or fused to extrude the material into a desired shape.

That is, in the present invention, a plurality of areas are provided in one cross section so that a circuit is formed.

The line element here includes those with a tip end in the shape of a needle or others.

(Circuit Element)

The circuit element here includes an energy conversion element, for example. The energy conversion element is an element which converts light energy to electric energy or changes electric energy to light energy. Electronic circuit, magnetic circuit and optical circuit elements are included. The circuit element is different from optical fibers which simply transmits a signal or conductors.

As the circuit element, an electronic circuit element or an optical circuit element are examples. To be concrete, it is a semiconductor element, for example.

When classified according to difference in the conventional process technologies, discrete (discrete semiconductor), optical semiconductor, memory, etc. are examples.

To be more concrete, there are diode, transistor (bipolar transistor, FET, insulated gate transistor), thyristor, etc. as discrete. Optical semiconductors include light emitting diode, semiconductor laser, light emitting device (photo diode, phototransistor, image sensor) are examples. As memory, DRAM, flash memory, SRAM, etc. are included.

(Formation of Circuit Element)

In the present invention, the circuit element is formed continuously or intermittently in the longitudinal direction.

That is, a plurality of areas are provided in a perpendicular cross section in the longitudinal direction, and said plurality of areas are arranged so as to form a single circuit element. And the cross section continues in the filament state continuously or intermittently in the longitudinal direction.

In the case of an NPN bipolar transistor, for example, it is comprised of three areas: an emitter N area, a base P area and a collector P area. Thus, these 3 areas are arranged with a required inter-area junction in the cross section.

For the arrangement, there can be a method for arranging each of the areas in order from the center of formation in the concentric state, for example. That is, it is only to form the emitter area, base area and collector area sequentially from the center. It is needless to say that another arrangement can be made, and the topologically same arrangement may be used as appropriate.

An electrode to be connected to each of the areas may be connected to each of the areas from an end face of a filament element. Or it can be embedded in each area in advance. That is, when each of the semiconductor areas is arranged in the above concentric state, an emitter electrode is provided at the center of the emitter area, a base electrode in the base area and a collector electrode on the outer circumference of the collector area continuously in the longitudinal direction as each of the semiconductor area. The base electrode can be divided for arrangement.

The above NPN bipolar transistor can be integrally formed by extrusion, which will be described later.

The NPN transistor was used as an example in the above, but other circuit elements may be also formed by arranging a plurality of areas in the cross section with required joint and forming the cross sections continuously in the longitudinal direction by extrusion, for example.

(Continuous Formation, Intermittent Formation)

The circuit element has, when formed continuously, a cross section in the same shape anywhere such as a candy-bar with the same cross section over the length.

The same circuit element may be formed with same elements continuously in the longitudinal direction or intermittently.

(Linear)

The outer diameter of the line element in the present invention is preferably 10 mm or less and more preferably, 5 mm or less. 1 mm or less is more preferable, and 10 µm or less is furthermore preferable. It is possible to make it 1 µm or less or further 0.1 µm or less by applying drawing processing. In order to weave the line element into a fabric state, it is more preferable if the outer diameter is smaller.

If a super-fine filament with the outer diameter of 1 µm or less is to be discharged from a hole of a mold for formation, there can be clogging of the hole or breakage of the filament. In these cases, a linear object of each area is formed first. Then, supposing this linear object as an island, and many islands are formed, and their periphery (sea) is surrounded by a soluble object. And they are bundled by a funnel shaped mouthpiece and made to discharge as a single linear object from a small mouth. By increasing the island component to make the sea component small, an extremely fine line element can be made.

As another method, a thick line element is made once and then, drawn in the longitudinal direction. Also, it is possible to realize super fineness by loading a fused material on a jet stream for melt blow.

An aspect ratio can take an optional value by extrusion. In the case of spinning, 1000 or more in the filament state is preferable. 100000 or more is possible, for example. In the case of use after cutting, it can be a small unit of line element of 10 to 10000, 10 or less, 1 or less or further 0.1 or less.

(Intermittent Formation)

If the same element is to be formed intermittently, elements adjoining in the longitudinal direction can be different. It can be formed in the longitudinal direction in order of, MOSFET (1), separation layer between elements (1), MOSFET (2), separation layer between elements (2) . . . MOSFET (n), separation layer between elements (n).

In this case, the length of MOSFET (k) (K=1~n) and other MOSFET can be the same or different. The length can be selected as appropriate according to the characteristics of a desired circuit element. The same applies to the length of the separation layer between elements.

It is needless to say that another layer may be interposed between MOSFET and the separation layer between elements.

In the above explanation, MOSFET was used as an example, but in forming another element, a layer required for application of another element is inserted intermittently.

(Cross Sectional Shape)

The cross sectional shape of the line element is not particularly limited. It can be a circle, polygon, star or any other shapes, for example. It can be a polygon with plural vertical angles which are acute.

Also, the cross section of each area can be optional. That is, in the case of a structure shown in FIG. 1, for example, a gate electrode may be in the shape of a star, while the outer shape of the line element can be circular. If a contact surface with the adjacent layer is to be made large depending on the element, it is preferable to have a polygon shape with acute vertex angles.

A desired shape of the cross section can be easily realized by having the desired shape of an extrusion die.

If the cross section of the outermost layer is in the shape of a star or a shape with acute vertex angles, another optional material can be embedded by dipping into a space between the vertex angles after extrusion, for example, and the characteristics of the element can be changed depending on application of the element.

Also, by engaging a line element with the recess shaped cross section with a line element with the projecting shaped cross section, connection between line elements can be made effectively.

If doping of impurities into a semiconductor layer is desired, the impurities can be contained in a fusion material, but it is possible to pass it through a vacuum chamber in the line state after extrusion and dope the impurities in the vacuum chamber by ion implantation, for example. If the semiconductor layer is formed not on the outermost layer but inside, ion can be implanted only into the semiconductor layer, which is an inner layer, by controlling ion radiation energy.

(Manufacture Example, Post-Processing Formation)

The above manufacture example is an example of integral forming of an element having a plurality of layers by extrusion, but it can be also formed by forming a base part of the element in the line state by extrusion and coating the base part after that by an appropriate method.

(Raw Material)

As a material for the electrode, semiconductor layers, etc., it is preferable to use an electrically conductive polymer. They can be polyacetylene, polyacene, (oligo acene), polythiazyl, polytiophene, poly (3-alkyl tiophene), oligo tiophene, poly pyrrole, polyaniline, polyphenylene, etc. A material for an electrode or a semiconductor layer may be selected from them, considering conductivity and so on.

As a material for semiconductor, polyparaphenylene, polytiophene, poly (3-methyltiophene) are used suitably.

Also, as a source/drain material, those with dopant mixed in the above semiconductor material can be used. To have n-type, alkali metal (Na, K, Ca) may be mixed. $AsF_5/AsF_3$ or $ClO_4^-$ is used as a dopant in some cases.

Fullerene can be used as an electrically conductive polymer material. In this case, it is used as an accepter.

As an insulating material, a general resin material can be used. Also, an inorganic material such as $SiO_2$ can be used.

In the case of a line element in the structure having a semiconductor area or an electrically conductive area at the center, the center area can be constituted by an amorphous material (metal material such as aluminum, copper, etc.; semiconductor material such as silicone). A line-state amorphous material is inserted into the stop part of a die to make the line-state amorphous material run, and its outer circumference can be coated by the other desired areas by injection.

BEST MODE FOR CARRYING-OUT THE INVENTION

Example 1

Figure 1:
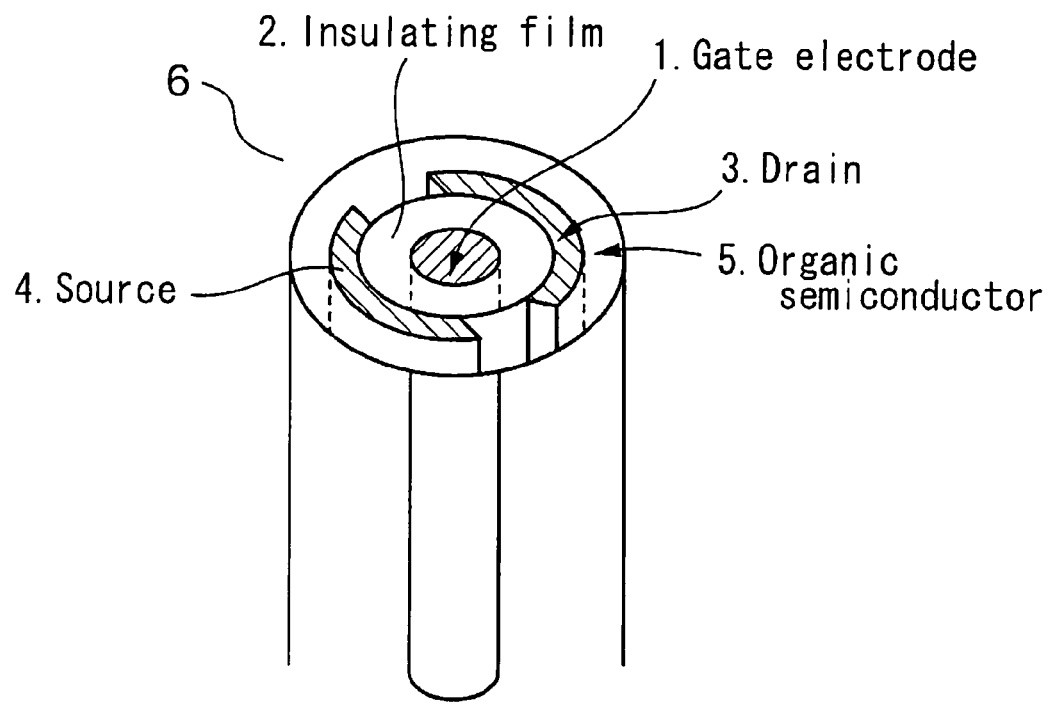
FIG. 1 is a perspective view showing a line element according to a preferred embodiment.
Figure 1:
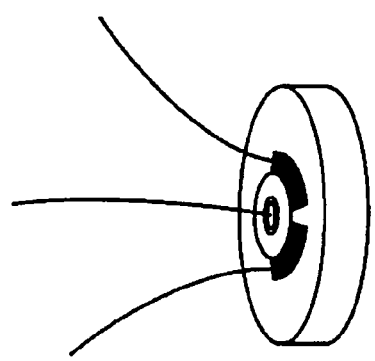

FIG. 1 shows a line element according to an example of the present invention.

6 is a line element and indicates MOSFET in this example. In this element, in its cross section, a gate electrode area 1 is provided at the center, outside of which are formed an insulating area 2, a source area 4, a drain area 3 and a semiconductor area 5 sequentially.

Figure 2:
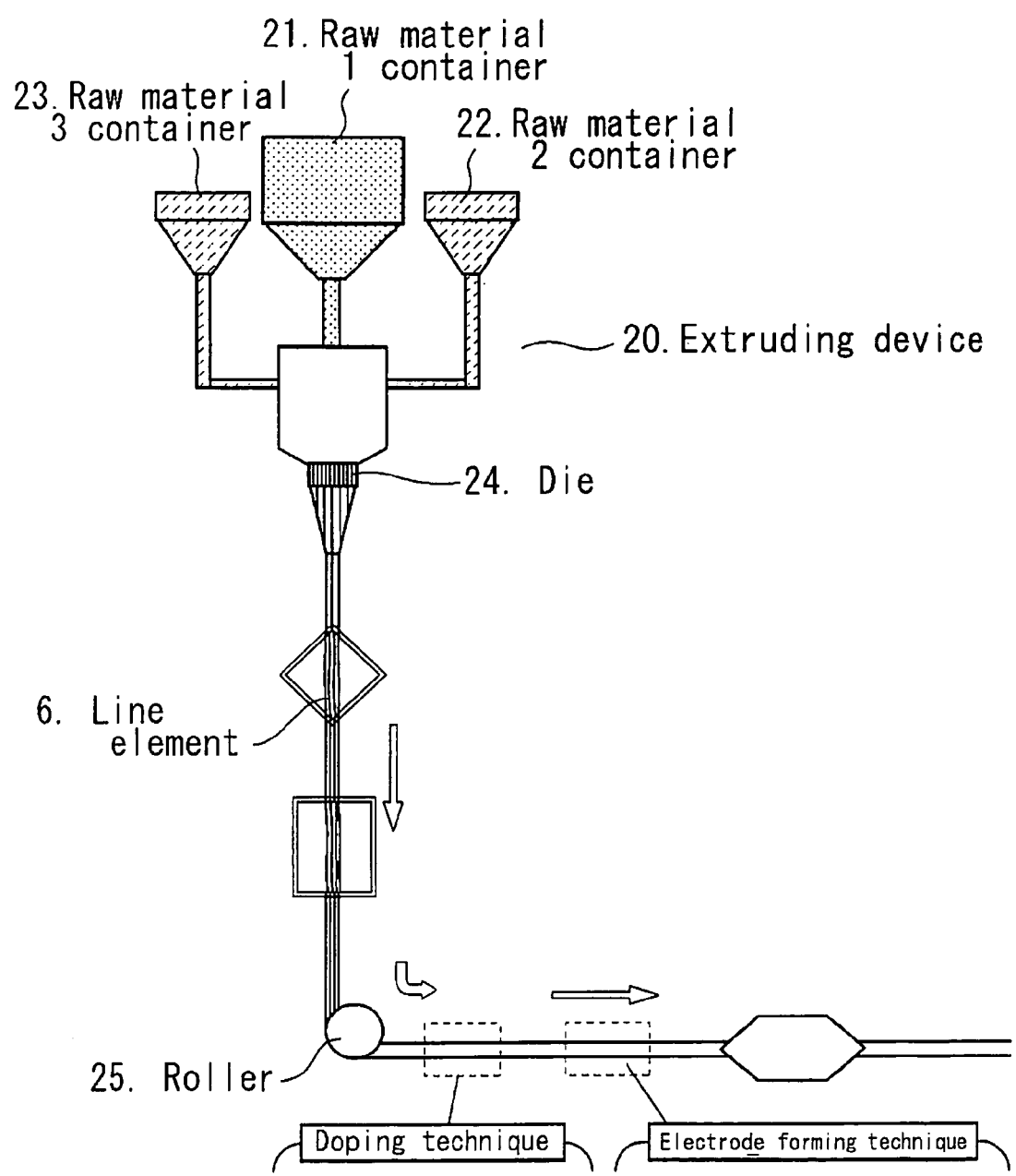
FIG. 2 is a conceptual front view showing a manufacturing device example of the line element.

In the meantime, in FIG. 2, a general constitution of an extruding device for forming such a line element is shown.

An extruding device 20 has raw material containers 21, 22 and 23 for holding a material for constituting a plurality of areas in the melted state, fused state or gel state. In the example shown in FIG. 2, three raw material containers are shown, but they can be provided as appropriate according to the constitution of the line element to be manufactured.

The raw material in the raw material container 23 is fed to a die 24. In the die 24, injection holes according to the cross section of the line element to be manufactured are formed. Linear objects injected from the injection holes are wound around a roller 25 or fed in the line state to the next process when necessary.

Figure 3:
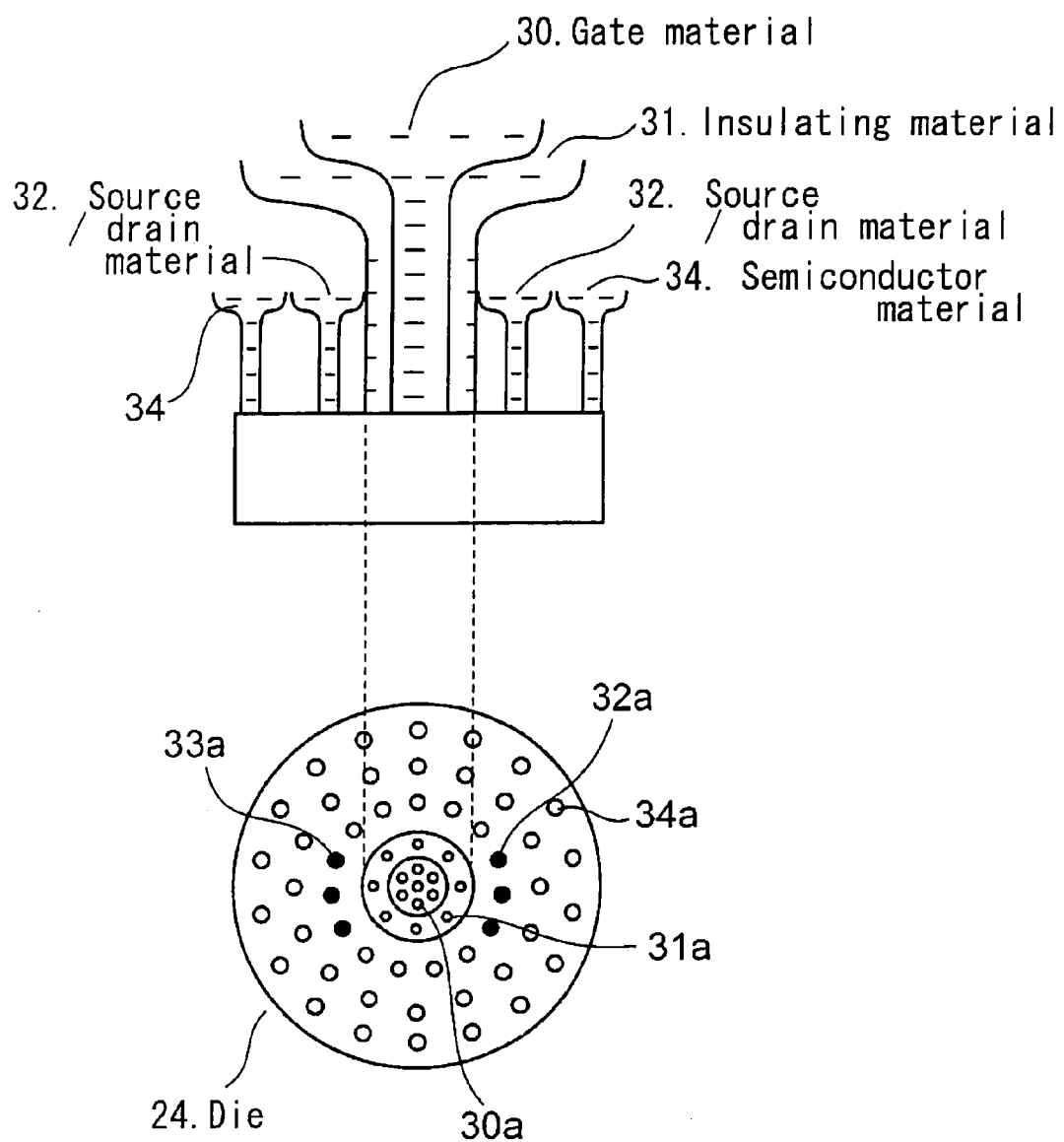
FIG. 3 is a front view showing an extruding device used for manufacture of the line element and a plan view of a die.

In the case of manufacture of the line element in the structure shown in FIG. 1, a constitution shown in FIG. 3 is used.

In the raw material containers, a gate material 30, an insulating material 31, a source/drain material 32 and a semiconductor material 34 are held in the respective containers in the melted, fused or gel state. In the meantime, in the die 24, holes are formed in communication with the respective raw material containers.

That is, at the center part, a plurality of holes 30a for injecting the gate material 30 are formed. On its outer periphery, a plurality of holes 31a for injecting the insulating material 31 are formed. And further on its outer periphery, a plurality of holes are formed, and only part of these plural holes 32a and 33a are in communication with the source/drain raw material container 32. The other holes 34a are in communication with the semiconductor material container 34.

From each of the raw material containers, the raw material in the melted, fused or gel state is fed to the die 24, and when the raw material is injected from the die 24, the raw material is injected from each of the holes and solidified. By pulling its end, the line element can be formed continuously in the filament state.

The filament-state line element is wound around the roller 25. Or, it is fed in the filament state to the next process when necessary.

As a gate electrode material, an electrically conductive polymer may be used. For example, polyacetylene, polyphenylene vinylene, polypyrrole, etc. are used. Especially, it is preferable to use polyacetylene, since a line element with smaller outer diameter can be formed.

As a semiconductor material, polyparaphenylene, polytiophene, poly (3-methyltiophene), for example, are preferably used.

As a source/drain material, those with dopant mixed in the above semiconductor material may be used. To have an n-type, alkali metal (Na, K, Ca), for example, may be mixed. $AsF_5/AsF_3$ or $ClO_4$ is used as a dopant in some cases.

As an insulating material, a general resin material may be used. Also, an inorganic material such as $SiO_2$ can be used.

The materials cited above are also used for the line element shown in the following examples.

In this example, a discharge electrode is connected to the end face of the line element. It is needless to say that a discharge port can be provided on the side at an appropriate location in the longitudinal direction.

Example 2

Figure 4:
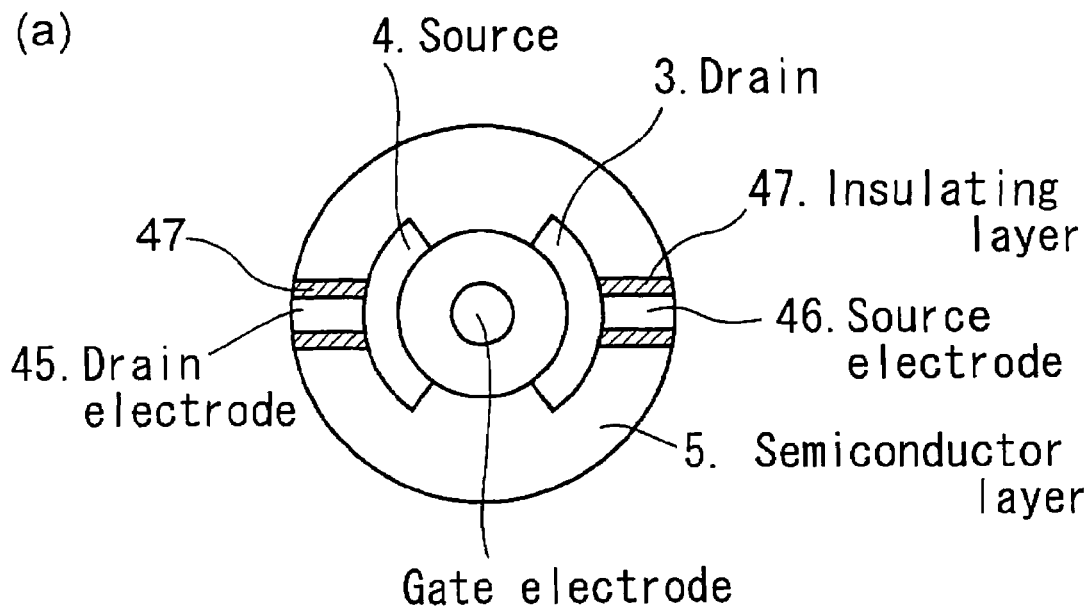
FIG. 4 is a view showing a preferred embodiment of the line element.
Figure 4:
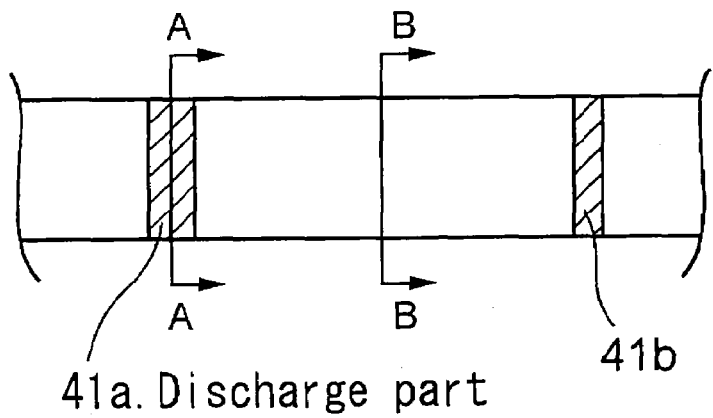

A line element according to the example 2 is shown in FIG. 4.

In this example, the discharge electrode in the example 1 is provided on the side of the line element. Discharge parts 41a, 41b shown in FIG. 4(b) can be provided at desired locations in the longitudinal direction. An interval between the discharge part 41a and the discharge part 41b can be a desired value.

A-A cross section of the discharge part 41 is shown in FIG. 4(a). B-B cross section in FIG. 4(b) is structure of the end face shown in FIG. 1.

In this example, a source electrode 45 and a drain electrode 46 as the discharge electrode are connected respectively to a source 4 and a drain 4 on the side of the source 4 and the drain 3. Also, a semiconductor layer 5 and a source electrode 45, a drain electrode 46 are insulated by an insulating layer 47.

Figure 5:
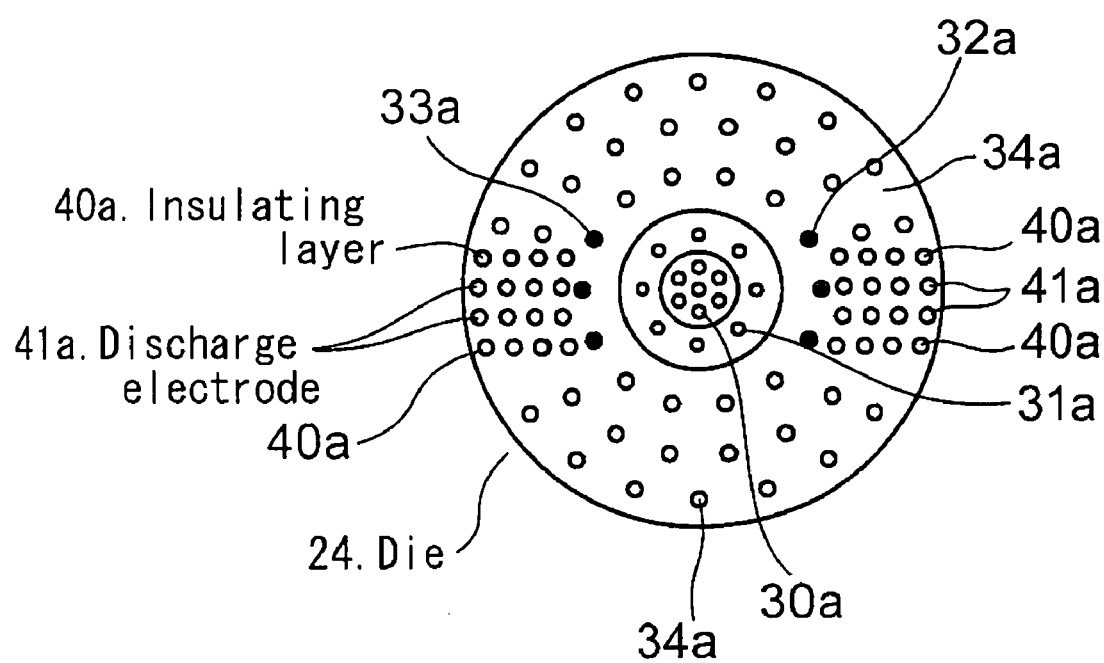
FIG. 5 is a plan view of a die used for manufacture of the line element.

In order to have such a structure, a die shown in FIG. 5 is used. That is, a hole 40a for the insulating layer and a hole 41a for the discharge electrode are provided on the side of the source/drain material injection ports 33a, 34a. The hole 40a for the insulating layer is in communication with a insulating layer material container (not shown), while the hole 41a for the discharge electrode is in communication with a discharge electrode material container (not shown).

In this case, first, raw materials are injected only from 30a, 31a, 32a, 33a and 34a. That is, injection from 40a and 41a is turned off. The semiconductor layer material goes over to portions corresponding to 40a, 41a and is extruded with the cross section shown in the example 1. At this time, the width of the insulating layer 47, drain electrode 46 and source electrode 45 are made small. When injection from 40a and 41a is turned off, the material forming the semiconductor layer goes over to the portions.

Next, the injection from 40a, 41a is turned on. By this, the cross sectional shape is changed and the material is extruded with the cross section shown in FIG. 5. By changing the time to turn on or off 40a, 41a as appropriate, the length of the A-A cross section and the B-B cross section can be adjusted to an optional one.

There is an example in which the cross sectional shape is formed intermittently, and A-A can be another cross sectional shape or material. For example, the A-A portion as a whole can be the insulating layer. The other end-face shapes can be also formed by the same method.

If the areas of the drain electrode 46 and the source electrode 45 are made larger and injection from the hole 41a for the discharge electrode is turned off, the material of the semiconductor layer or the material of the insulating layer does not fully go over, but a portion corresponding to the source electrode/drain electrode becomes a space. It is only to embed the electrode material in that space after extrusion.

Example 3

Figure 6:
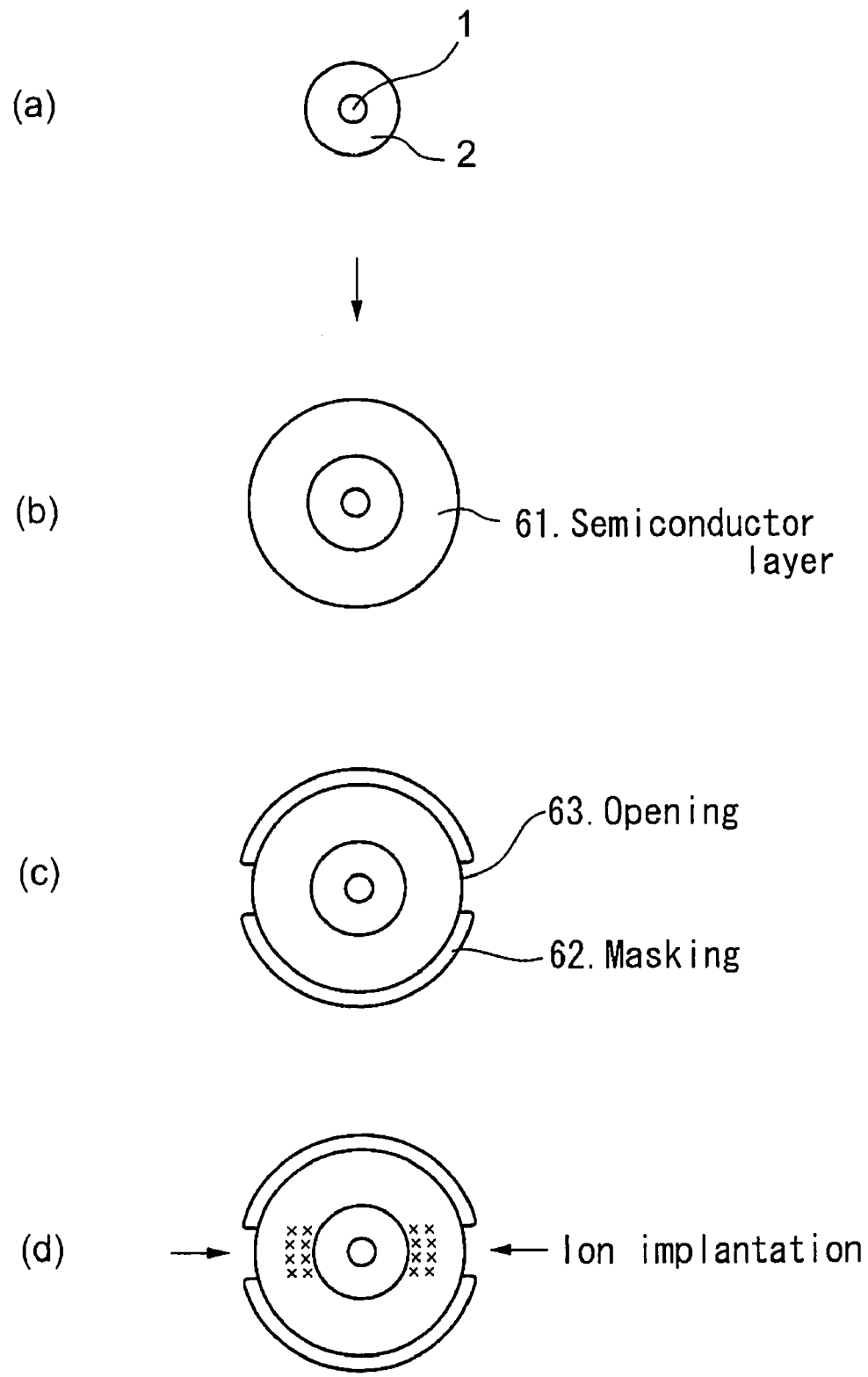
FIG. 6 is a cross sectional view showing a manufacture process example of the line element.

The example is shown in FIG. 6.

The cases of integral formation of the line element by extrusion are shown in the examples 1 and 2, but in this example, a part of the line element is formed by extrusion, while the other is formed by external processing.

As the line element, the line element shown in the example 2 is used as an example.

First, a filament-state intermediate body is formed by extruding a gate electrode 1 and an insulating film 2 (FIG. 6(*a*)).

Next, outside of the insulating film 2 is coated by the semiconductor material in the melted, fused or gel state to form a semiconductor layer 61 to have a secondary intermediate body (FIG. 6(*b*)). For such coating, it is only necessary to pass a filament-state intermediate body through the semiconductor material in the melted, fused or gel state in a tank. Or, a deposition method or the like can be adopted.

Next, outside of the semiconductor layer 61 is coated by a masking material 62. Coating of the masking material 61 can also be formed by passing the secondary intermediate body through the melted, fused or gelled masking material.

Then, a predetermined location of the masking material 62 (location corresponding to drain/source) is removed by etching or the like to form an opening 63 (FIG. 6(*c*)).

Then, while passing the filament-state secondary intermediate body through a decompression chamber, ion implantation is conducted by controlling an injection range (FIG. 6(*d*)).

Then, by passing it through a thermal processing chamber for annealing, the source area and the drain area are formed.

In this way, it is only necessary to combine extrusion and external processing as appropriate according to arrangement or material of an area to be formed.

Example 4

This example shows an example to sequentially form each area in the line element shown in FIG. 1.

Figure 7:
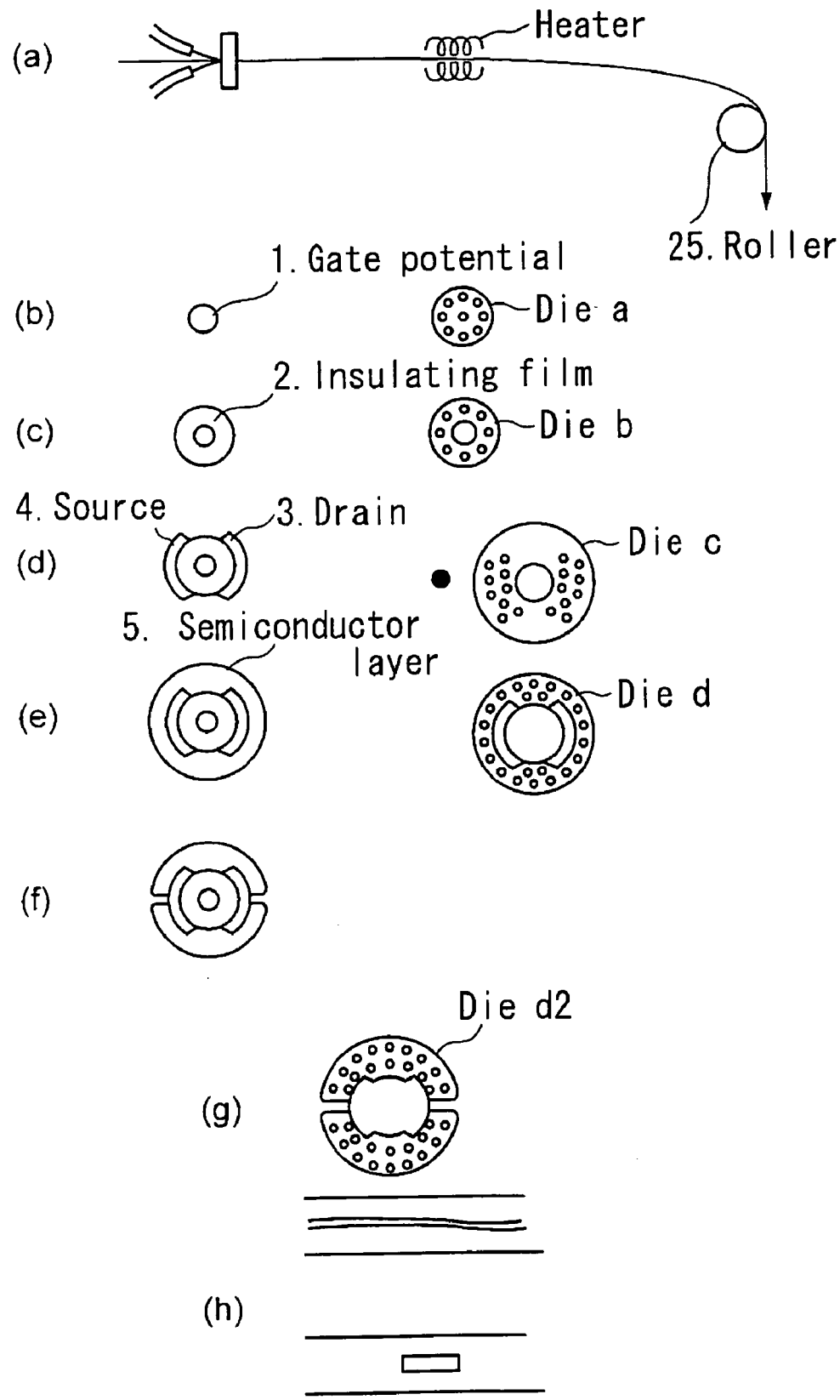
FIG. 7 is a view showing a manufacture process example of the line element.

The procedure is shown in FIG. 7.

First, by a spinning technique, a gate electrode material is injected from the hole of a die a so as to form the gate electrode 1 (FIG. 7(*b*)). This gate electrode 1 is called as an intermediate filament for convenience.

Then, as shown in FIG. 7(*a*), the intermediate filament is inserted through the center of a die b, and while having the intermediate filament run, the insulating film material is injected from a hole formed in the die b so as to form the insulating film 2 (FIG. 7(C)). A heater is provided on the downstream side of the die b. The filament is heated by this heater as necessary. By heating, it becomes possible to remove a solvent component in the insulating film from the insulating film. It also applies to the following formation of the source/drain layer, semiconductor layer.

Then, while having the intermediate filament run, the source/drain layers 3, 4 are formed (FIG. 7(*c*), (*d*)). The source area 4 and the drain area 3 are formed separately on the insulating film 2. This becomes possible by providing a hole only a part of a die c.

Next, while inserting the intermediate filament through the center in the die and having it run, the semiconductor layer 5 is similarly formed.

As shown in FIG. 7(*f*), when a discharge electrode for source/drain is to be provided on a part in the longitudinal direction, it is only necessary to turn off supply of a raw material from a part of a plurality of holes provided on a die d (holes of a portion corresponding to the source/drain electrode). Also, when a hole for discharge is to be provided over the longitudinal direction, a die d2 as shown in FIG. 7(*g*) is used to form the semiconductor layer.

Example 6

Figure 8:
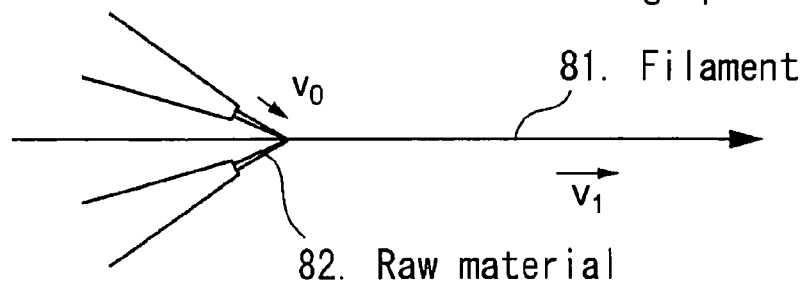
FIG. 8 is a view showing a manufacture example of the line element.
Figure 8:
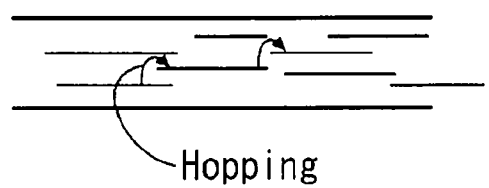
Figure 8:
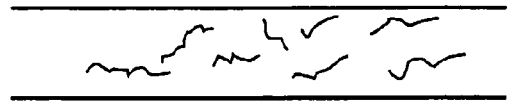

The example 6 is shown in FIG. 8.

This example is an injection example of an electrically conductive polymer when the electrically conductive polymer is used as a forming material of a semiconductor element.

The example 5 shows an example to form an outer layer on the surface of the intermediate filament while inserting the intermediate filament through the die. This example shows a case where this outer layer is the electrically conductive polymer.

A raw material 82 ($v_1 - v_0$) is 1 mm/sec or more. Preferably, it is 20 m/sec or more. More preferably, it is 50 m/sec. Furthermore preferably, it is 100 m/sec or more. An upper limit is a speed at which the intermediate filament is not cut. The speed at which cutting occurs depends on a discharge amount of a material, viscosity of a material, an injection temperature, etc., but to be concrete, it is only necessary to acquire it in advance by experiments by setting conditions such as materials to be used.

To a material injected by setting a difference between the injection speed $v_0$ and the running speed $v_1$ at 1 m/sec or more, acceleration and an external force are applied. A main direction of the external force is the running direction. A molecular chain in the electrically conductive polymer is usually in the twisted state as shown in FIG. 8(*c*), and its longitudinal direction is at random. However, when the external force is applied in the running direction together with the injection, the molecular chain is untwisted as shown in FIG. 8(*b*) but is oriented horizontally in the longitudinal direction.

Electron (or hole) moves, as shown in FIG. 8(*b*), by hopping to a molecular chain at the closest level. Thus, when the molecular chain is oriented in the horizontal direction as shown in FIG. 8(*b*), hopping of electron is extremely easy to occur as compared with the case of random orientation as in FIG. 8(*c*).

By applying the external force to the running direction with the injection, the molecular chain can be oriented as shown in FIG. 8(*b*). Also, it becomes possible to reduce the distance between the molecular chains.

It is needless to say that this example can naturally be applied to formation of a predetermined area with an electrically conductive polymer also in the other examples.

By setting the orientation rate of the molecular chain in the longitudinal direction at 50% or more, movement degree of the electron is increased and the line element with more excellent characteristics can be provided. A high orientation rate can be also controlled by controlling the difference between the injection speed and the running speed. Also, it can be controlled by controlling the elongation rate in the longitudinal direction.

The orientation rate here refers to a proportion multiplied by 100 of the number of molecules having an inclination of 0 to ±5° with respect to the longitudinal direction against the total number of molecules.

By setting it at 70% or more, the line element with furthermore excellent characteristics can be obtained.

Example 7

Figure 9:
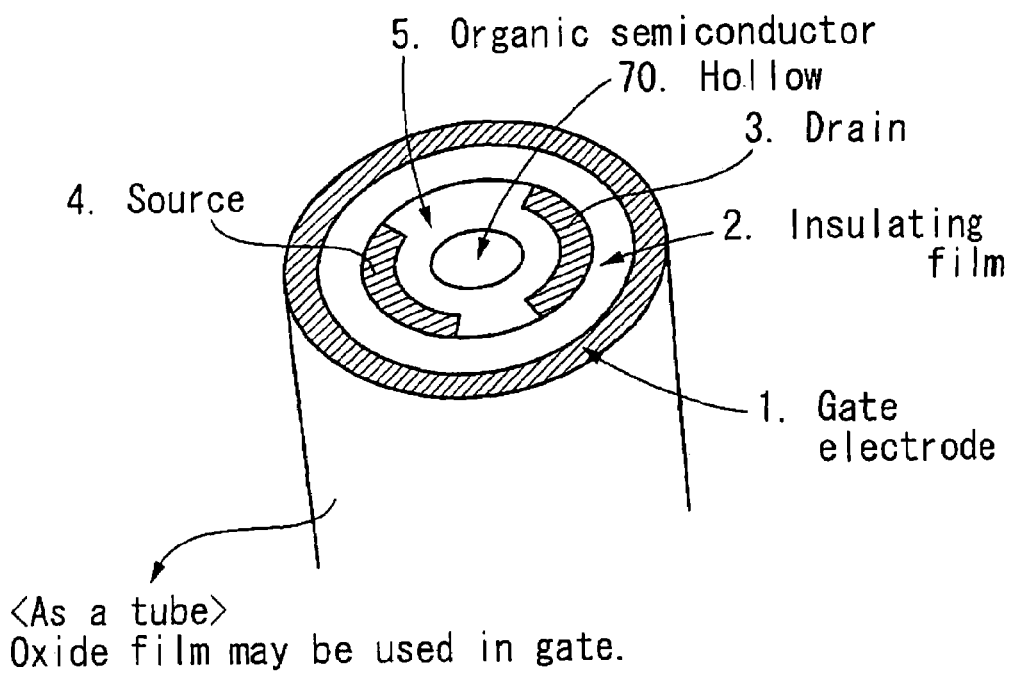
FIG. 9 is a perspective view showing the line element according to a preferred embodiment.
Figure 9:
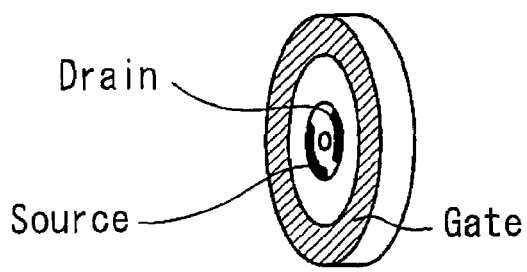

The line element according to the example 7 is shown in FIG. 9.

The line element in this example has a hollow area or insulating area 70 at the center, the semiconductor area 5 on its outside, the source area 4 and the drain area 3 in the semiconductor area 5 so that a part of it is exposed to the outside and the gate insulating film area 2 and the gate electrode area 1 on its outside.

A protective layer comprised of an insulating resin may be provided on the outside of the gate electrode area 1. An appropriate location of the protective layer may be opened to be a discharge part of the gate electrode.

In this example, too, a cross section having another shape may be inserted between cross sections shown in FIG. 7 at an optional position in the longitudinal direction as with the example 2.

In the case of the line element in this example, it is preferable that, after the hollow area 70 and the semiconductor area 5 are formed by extrusion, doping is conducted on the source area 4 and the drain area 3, and then, the insulating film area and the gate electrode area 1 are coated respectively for formation. As the insulating film 2, it is preferable to use an inorganic material such as $SiO_2$.

Example 8

Figure 10:
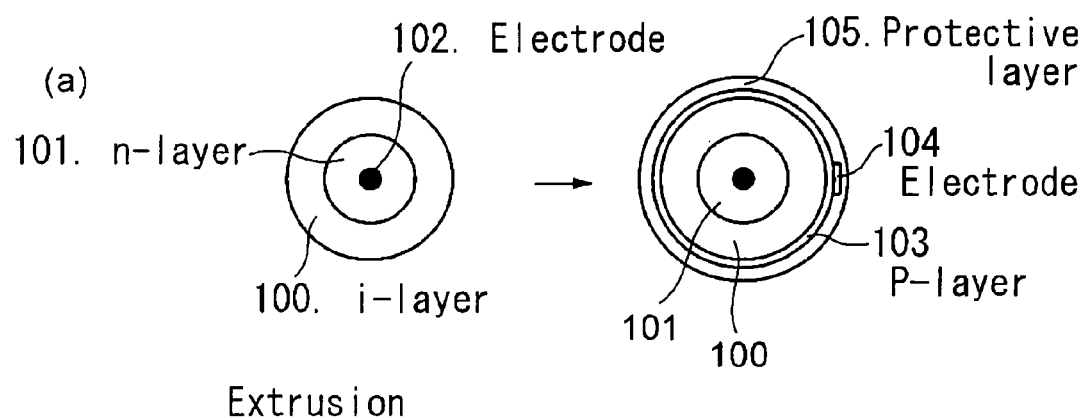
FIG. 10 is a cross sectional view showing the line element according to a preferred embodiment.
Figure 10:
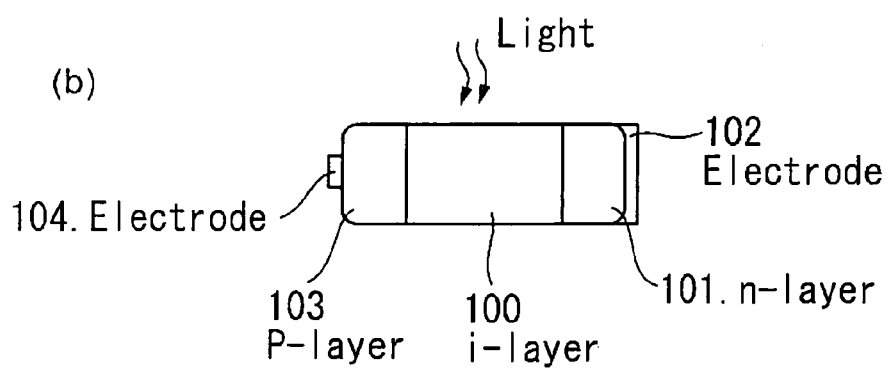

FIG. 10(*a*) shows the line element according to the example 8.

This example is a line element having a pin structure.

That is, an electrode area 102 is provided at the center, and on its outside, an n-layer area 101, an i-layer area 100, a p-layer area 103, an electrode area 104 are formed. In this example, a protective layer area 105 comprised of a transparent resin or the like is provided on the outside of the p-layer area 103.

This line element is integrally formed by extruding the electrode area 102, the n-layer area 101 and the i-layer area 100.

The p-layer area 103 and the electrode area 104 are formed by post-application processing such as coating, for example. By using post-application processing for the p-layer area 103, the thickness of the p-layer area 103 can be reduced. Therefore, if used as a photoelectromotive force element, it becomes possible to take in incident light from the p-layer 103 efficiently into a depletion layer.

Of course, the electrode area 102, the n-layer area 101, the i-layer area 100, the p-layer area 103 and the electrode area 104 may be integrally formed by extrusion.

In FIG. 10(*a*), the circumferential shape of the i-layer is circular, but it is preferable to have the star shaped. By this, the mating area between the p-layer 103 and the i-layer 100 is increased, whereby the conversion efficiency can be improved.

In the example shown in FIG. 10(*a*), the electrode 104 is provided at a part of the p-layer 103, but it can be formed covering the overall length.

In the case of the np structure, a $p^+$-layer may be provided between the p-layer 103 and the electrode 104. By providing a $p^+$-layer, ohmic contact between the p-layer 103 and the electrode 104 becomes easy. Also, electrons tend to flow to the i-layer side more easily.

As the semiconductor material to form the p-layer, the n-layer and the i-layer, an organic semiconductor material is used suitably. Polytiophene, polypyrrol and so on are used, for example. To have the p-type and the n-type, doping may be used as appropriate. Combination of p-type polypyrrole/n-type polytiophene can be used, too.

The electrically conductive polymer is preferable also as the electrode material.

Example 9

FIG. 10(*b*) shows the line element according to the example 9.

In the Example 5, the pin structure was formed concentrically, but in this example, it has a rectangular cross section. A p-layer area 83, an i-layer area 80 and an n-layer area 81 are arranged horizontally. Also, electrodes 82, 83 are formed on the side, respectively.

In this example, the cross section shown in FIG. 10(*b*) is formed continuously in the longitudinal direction.

The line element in this structure can be formed integrally by extrusion.

Example 10

In this example, an electrode area is provided at the center, and an area made of a material in which a p-type material and an n-type material are mixed is formed on its outer circumference. Further on its outer circumference, the electrode area is formed.

That is, in the above example, a diode element in the double-layered structure in which the p-layer is joined with the n-layer (or a three-layered structure with an i-layer interposed) is shown. However, this example is an example of a single-layered structure comprised of a material in which the p-type material is mixed with the n-type material.

The p-type/n-type mixed material can be obtained by mixing an electron-donating conductive polymer and an electron accepting conductive polymer.

When the element area is formed by the p-type/n-type mixed material, a simple structure can be obtained, which is preferable.

Example 11

In this example, the line element shown in the above example is further drawn in the longitudinal direction. The drawing method can be a technique to draw a copper wire or a copper pipe, for example.

By drawing, the diameter can be further reduced. Especially, when an electrically conductive polymer is used, the molecular chain can be made parallel in the longitudinal direction, as mentioned above. Moreover, an interval between the paralleled molecular chains can be reduced. Thus, hopping of electrons can be performed efficiently. As a result, the line element with more excellent characteristics can be obtained.

A drawing rate by drawing is preferably 10% or more. 10 to 99% is more preferable. The drawing rate is 100×(area before drawing−area after drawing)/(area before drawing).

The drawing can be repeated several times. In the case of a material with a modulus of elasticity which is not so large, it is only necessary to repeat drawing.

The outer diameter of the line element after drawing is preferably 1 mm or less. 10 μm or less is more preferable. 1 μm or less is furthermore preferable. 0.1 μm or less is the most preferable.

Example 12

Figure 11:
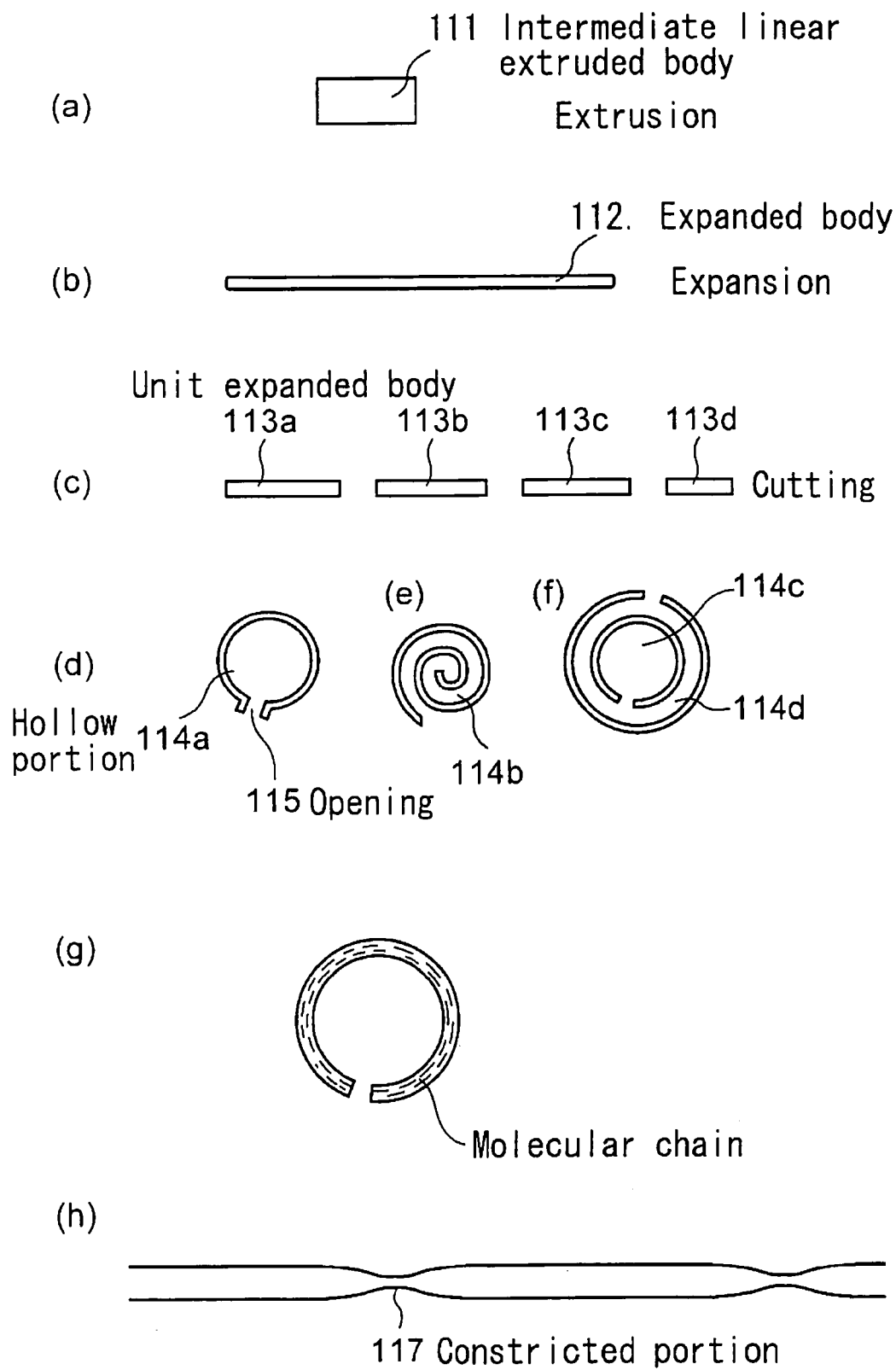
FIG. 11 is a process diagram showing a manufacture example of the line element.

FIG. 11 shows the example 12.

In this example, a raw material is formed into the line state with the rectangular cross section by extrusion so as to manufacture the intermediate linear extrusion 111 (FIG. 11(*a*)). It can be extruded to another cross-sectional shape.

Then, the intermediate line extrusion 111 is expanded in the lateral direction in the cross section or in the cross-sectional vertical direction to form an expanded body 112 (FIG. 11(b)). In this Fig., an example of expansion in the lateral direction is shown.

Then, the expanded body 112 is cut to an appropriate number in parallel in the longitudinal direction to produce a plurality of unit expanded bodies 113a, 113b, 113c, 113d. They can move on to the next process without this cutting.

Then, the unit expanded bodies are processed in an appropriate shape. In the example shown in the Fig., they are processed to the ring shape (FIG. 11(d)), spiral shape (FIG. 11(e)), and double ring shape (FIG. 11(f)).

Then, an appropriate material is embedded in hollow parts 114a, 114b, 114c and 114d. When the unit expanded body is the semiconductor material, the electrode material is embedded. It is needless to say that embedding can be done not after processing to the ring shape but at the same time with processing to the ring shape.

Also, in the case of the double structure as shown in FIG. 11(f), different materials may be used for the unit expanded body 114c and the unit expanded body 114d.

Also, the surface can be coated by another material after extrusion (FIG. 11(a)), after expansion (FIG. 11(b) or after cutting (FIG. 11(d)). Coating may be a method like dip, deposition, plating and others, for example. A material for coating can be selected as appropriate according to the function of the element to be produced. It can be any of the semiconductor material, magnetic material, electrically conductive material or insulating material. Also, it can be either of the inorganic material or organic material.

If the electrically conductive polymer is used as the expansion material in this example, the longitudinal direction of the molecular chain is oriented so that it is the right-and-left direction on the drawing which is the expansion direction. Therefore, after processing to the ring state, the longitudinal direction of the molecular chain is oriented in the circumferential direction as shown in FIG. 11(g). Thus, electrons are easy to hop in the radial direction.

Also, when processed in the ring state, if an opening 115 is provided, this opening can be used as a discharge port of electrodes or the like, for example. It can also be a connection part between line elements when an integrated device is made by weaving the line elements. Also, it can be used as a junction surface with another area.

After processed into the ring state or the like, the linear body having this ring shape or the like can be used as an intermediate body for completing the line element having the desired cross-sectional area.

As shown in FIG. 11(h), a constricted portion (a portion whose outer diameter geometry of the cross section is different from the other portions) 117 may be provided periodically or non-periodically at an appropriate position of the linear body in the longitudinal direction. When another line element is woven perpendicularly to the longitudinal direction, this constricted portion can be used as a mark for positioning. Such formation of the constricted portion can be applied not only to this example but to other line elements.

It is preferable to set the orientation rate of the molecular chain in the circumferential direction to 50% or more. It is more preferable to set it to 70% or more. By this, the line element with more excellent characteristics can be obtained.

Example 13

Figure 12:
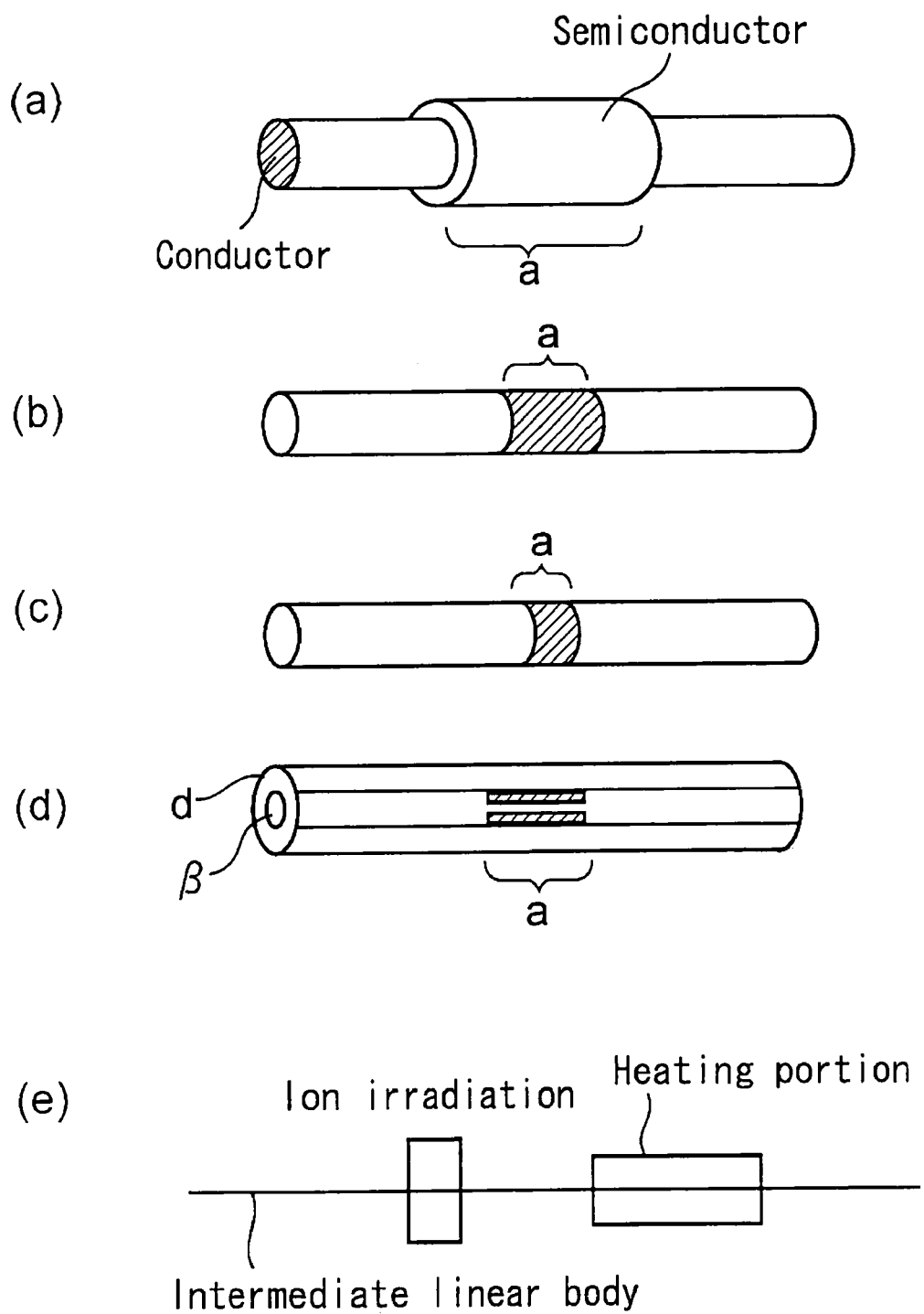
FIG. 12 is a perspective view showing a manufacture example of the line element.

In FIG. 12, a manufacture example of the element with the cross sectional shape formed intermittently is described in the above example, but in this example, another manufacture example in the case of extrusion is shown.

In FIG. 12, only a part of areas forming the circuit element is shown.

FIG. 12(a) shows injection of the semiconductor material only at a timing shown by a at injection of the semiconductor material. It may be so constituted that the conductor material is injected continuously, while the semiconductor material is injected intermittently to form the conductor and the semiconductor at the same time. Also, the conductor portion may be formed in the first and then, the semiconductor material is injected intermittently around the conductor while the conductor is made to run.

In an example shown in FIG. 12(b), the line-state semiconductor or insulator is formed in the first and then, coating is implemented by intermittent deposition or the like of an electric conductor in the longitudinal direction so as to provide a portion having a different cross-sectional area in the longitudinal direction.

In an example shown in FIG. 12(c), first, an organic material is formed in the line state. Then, light is irradiated intermittently in the longitudinal direction so that photo polymerization is generated at the irradiated portion.

By this, a portion having a different cross-sectional area can be formed in the longitudinal direction.

In FIG. 12(d), α is a light-transmitting electrically conductive polymer and β is an intermediate linear body formed by integral extrusion of two layers made of a photo-hardening electrically conductive polymer. When light is irradiated intermittently while this intermediate linear body is running, light hardening occurs at a portion. By this, a portion having a different cross-sectional area in the longitudinal direction can be formed.

FIG. 12(e) is an example in which ion irradiation is used. The linear body is made to run, and an irradiating device is provided in the middle. Ion is intermittently irradiated by ion irradiation. Ion may be irradiated from all the directions or only from a predetermined direction. It can be decided as appropriate according to a cross-sectional area to be formed. Also, the ion irradiation distance may be determined as appropriate.

A heating device is provided on the downstream side of the ion irradiating device for heating the linear body after ion irradiation. An ion-irradiated portion becomes another composition by heating.

In the case of irradiation from all the directions, all the surfaces become another composition. Also, in the case of ion irradiation only from a predetermine direction, only that portion becomes another composition.

As for the ion-irradiated portion, the intermediate linear body to be irradiated by ion is a single-layer structure in the example shown in FIG. 12(f), but it is possible to implant ion only inside by controlling the irradiation distance at ion irradiation, even when it is a double-layer structure. Another composition can be formed in the irradiated inside by thermal processing.

If a silicon linear element is used as the intermediate linear body and O ion is implanted, a $SiO_2$ area can be formed. By controlling the irradiation distance, a so-called BOX (embedded oxide film) can be formed. BOX was described as the case of intermittent formation of another cross-sectional area, but the BOX can be formed over the entire area in the longitudinal direction.

(Application 1)

This example is an example to form an integrated circuit by weaving a plurality of line elements.

Figure 13:
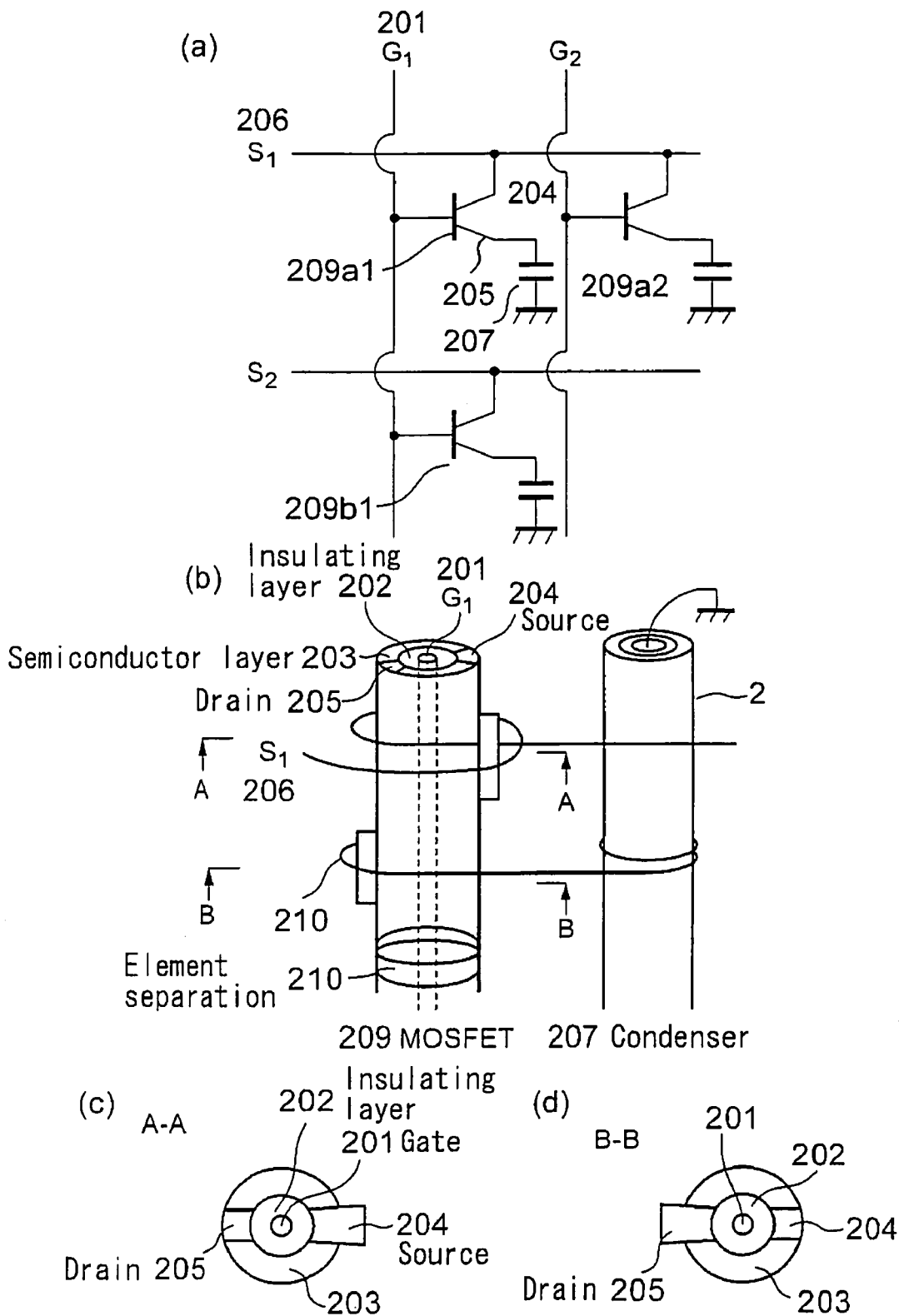
FIG. 13 is a view showing an application example to an integrated circuit device.

FIG. 13 shows an example of an integrated circuit.

The integrated circuit shown in FIG. 13 is a DRAM type semiconductor memory. The DARM memory is comprised of memory cells arranged horizontally and vertically, and its circuit is shown in FIG. 13(a).

One cell is made of a MOSFET 209a1 and a condenser 207. Each of the cells has conductors of bit lines S1, S2 . . . and word lines G1, G2 . . . connected.

As shown in FIG. 13(b), this cell is comprised by the MOSFET line element 209a1 and the condenser line element 207. The MOSFET line elements are prepared for the number of rows.

In this MOSFET 209a1, a gate electrode 201, an insulating layer 202, a source/drain 204, 205 and a semiconductor layer 203 are formed sequentially from the center to the outer circumference.

In the longitudinal direction, an element separation area 210 is formed. However, the gate electrode 201 penetrates a single linear body. That is, as one gate electrode as a common word line, a plurality of MOSFET 209a1, 209b1 . . . are formed in the longitudinal direction in one linear body.

Also, MOSFET 209a2, a3 . . . of FIG. 13(a) are constituted similarly by line elements.

It is preferable to constitute this MOSFET line element by a polymer material.

Also, a discharge part of the source area 204 is projected in the radial direction as shown in FIG. 13(c). That is for making it easer to contact the bit line S1. Also, as shown in FIG. 13(d), the drain area 205 is also projected in the radial direction. This projecting position is displaced between drain and source in the longitudinal direction.

In the meantime, for the condenser line element 207, an electrode, an insulating layer and an electrode are sequentially formed from the center to the outside.

S1 is a bit line and is formed in the line state. As a material, it is preferable to use an electrically conductive polymer. By winding this bit line S1206 around the source portion 204 to have contact with the source 204. This bit line S1 is wound around the source area of the line MOSFET element constituting MOSFET 209a2, a3 . . . respectively.

Also, the drain area 205 is connected to the condenser 207 with a linear electrically conductive polymer 210.

In the example shown in FIG. 13, the condenser is made as another line element, but it can be provided at an appropriate position of the linear body in which MOSFET is formed. By that, the number of used line elements is reduced, whereby integration can be further improved. Also, it is possible to directly join the condenser to the MOSFET line element using an electrically conductive adhesive or the like instead of connection with the electrically conductive polymer 210.

After the line element is woven horizontally and vertically as above, the entire surface is coated by an insulating material to prevent leakage of the conductive portion.

A diode may be used in place of the condenser.

(Application 2)

This example shows an integrated circuit formed by bundling a plurality of line elements.

In this example, too, an example to use MOSFET line element is shown. It is needless to say that another line element can be used.

A plurality of MOSFET line elements are prepared.

A signal input element is formed on an end face of each of the line elements so that various information can be sensed by bundling them. If a light sensor, ion sensor, pressure sensor, etc. are provided, for example, information corresponding to five senses of a human can be sensed.

For example, if a sensor corresponding to 100 types of signal is to be formed by a conventional board-type semiconductor integrated circuit, a photolithographic process should be repeated 100 times for production. However, if the end face of the line element is used, such repetition of the photolithographic process is not needed but a sensor corresponding to 100 types of signal can be made easily without repeating the photolithographic process. Also, a high-density sensor can be obtained.

(Application 3)

Application as a photoelectromotive force integrated device is possible as mentioned below.

The photoelectromotive force device can be formed by bundling, twisting or weaving the line element having the pin structure. It is preferable to constitute the pin layer by an electrically conductive polymer. Also, it is preferable to add a sensitizer.

For example, a fabric can be made by weaving the line element, and this fabric can be made into clothes. In this case, the line element as a whole becomes a light receiving area, and incident light can be received from an angle of 360°. Not only that, light can be received three-dimensionally, by which a photoelectromotive force element with excellent light receiving efficiency can be obtained.

Also, efficiency to take in light is extremely high. That is, light which was not inputted to the line element but reflected is inputted to another line element since it is taken into the fabric and reflected repeatedly. The above line element is preferably formed by extrusion.

It is only necessary to connect electrodes from each of the elements to a collecting electrode and to provide a connection terminal at this collecting electrode.

Also, by incorporating a battery in the lining of the clothes, electricity can be used in a dark place, too.

Also, by providing a heating element in the clothes, clothes having heating effect can be gained.

Moreover, by coating the line heating element with the insulating layer and weaving it in the fabric state with the line-state photoelectromotive force element, clothes with heating effect can be produced.

Also, the line element can be implanted in a board in the desired shape to have a solar battery. That is, by implanting the line element in the fluffy or erinaceous state, a solar battery with extremely high light taking-in efficiency can be obtained.

For a communication satellite, reduction of the entire weight is desired. The above solar cell is so light-weight that it is effective as a generating device in the communication satellite.

As it has flexibility, it can be formed along a desired shape and can be applied to the outer surface of the communication satellite using an adhesive.

By easily implanting the line-state photoelectromotive force element on the surface of a board conforming to the shape of a human head, an artificial wig having a power generating function can be obtained.

Also, when using a superfine line element, it can realize a leather-like surface having suede effect. Such a line element can be made into a bag. That is, a bag having a power generating function is achieved.

(Application 4)

Figure 14:
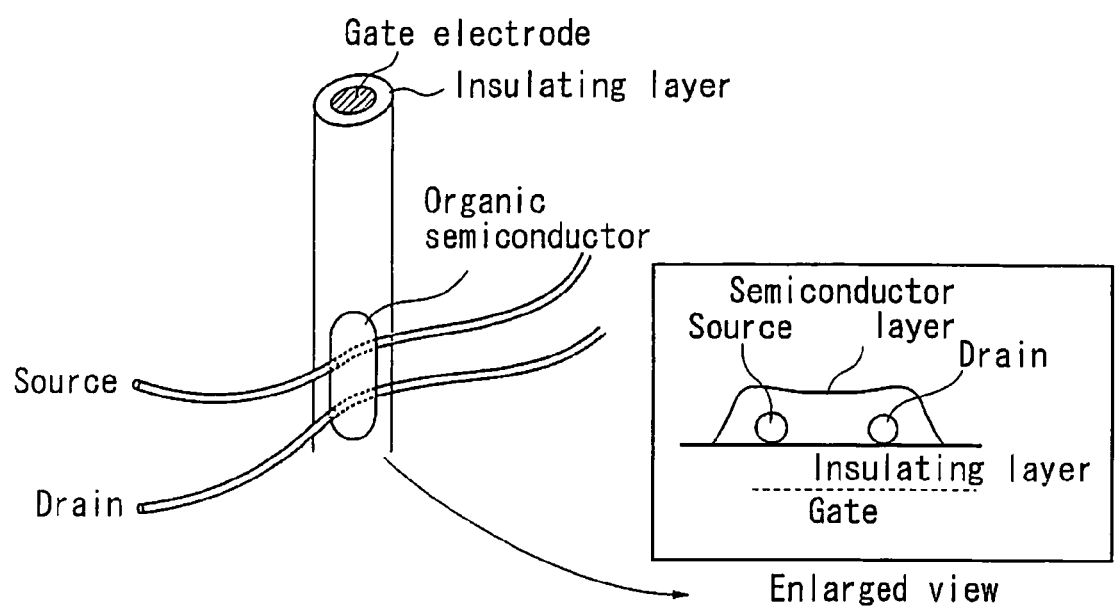
FIG. 14 is a view showing an application example to an integrated circuit device.

FIG. 14 shows another application.

In this example, the line-state source electrode and the drain electrode are made into contact with an appropriate position of a linear body in which a gate electrode is coated by an insulating layer. An organic semiconductor material is applied to a range across the contact portion of the source electrode and the contact portion of the drain electrode.

Figure 15:
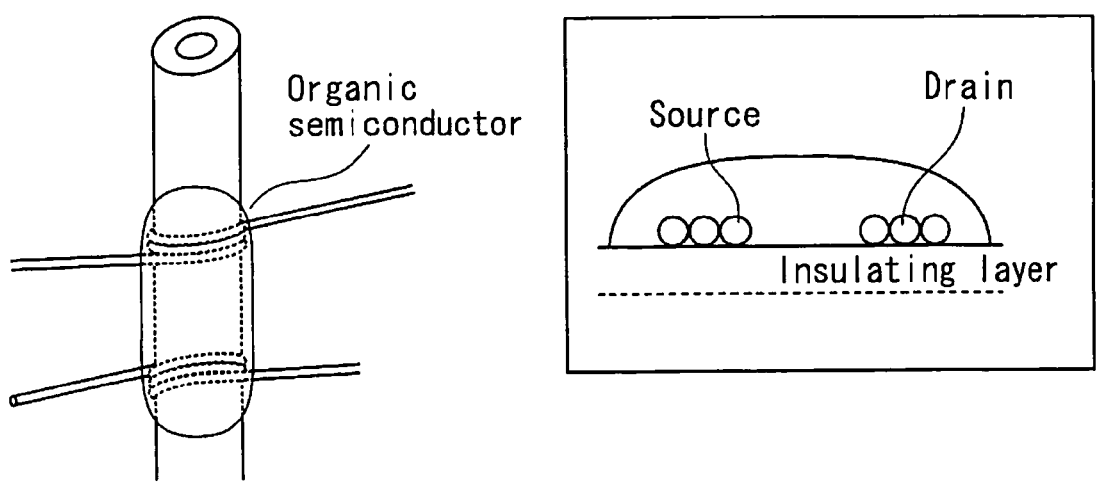
FIG. 15 is a view showing an application example to an integrated circuit device.

Also, as shown in FIG. 15, the line-state source electrode or drain electrode may be wound once or several times around the linear body in which the gate electrode is coated by the insulating layer. By winding, sufficient contact can be secured. By providing a constricted portion on the linear body, it is convenient to position winding or the like.

Figure 16:
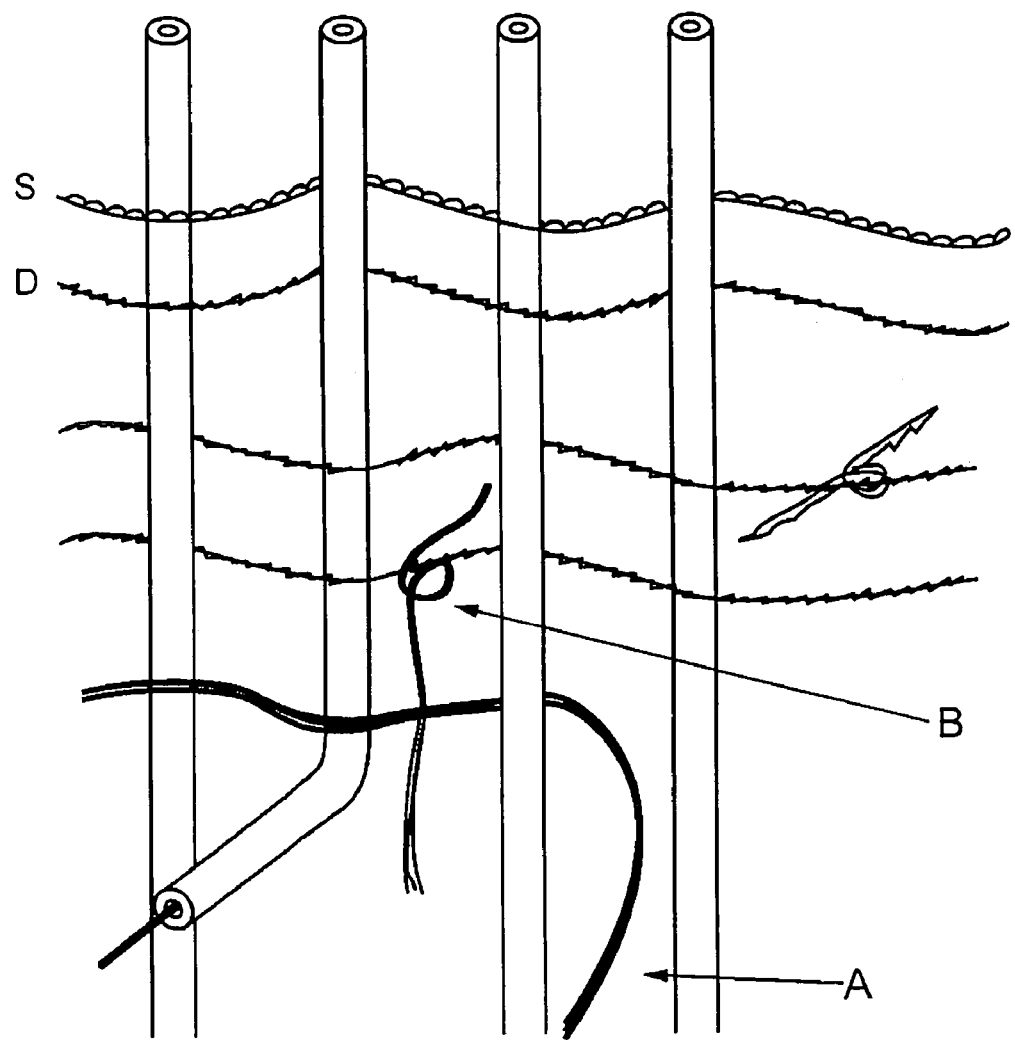
FIG. 16 is a view showing an application example to an integrated circuit device.

As shown in FIG. 16, the source electrode/drain electrode can be brought into contact only with an appropriate linear body (A point). Or, the source/drain electrodes can be connected to each other with still another conductor (B point).

In FIG. 16, an example of a single row is shown but arrangement in plural rows is also possible. In this case, it is only necessary to have three-dimensional connection. Since the linear body, source electrode and drain electrode have flexibility, they can be bent in a desired direction at a desired position.

If MOSFET line element is used as a linear body, for example, and connected to each other three-dimensionally at a desired position, a desired logical circuit can be assembled. When a conventional semiconductor board is used for basic constitution, it can not be avoidable that a current channel becomes longer, but if the line element is used, the current channel can be extremely short, whereby an extremely high-speed logical circuit can be constituted.

Example 14

Figure 17:
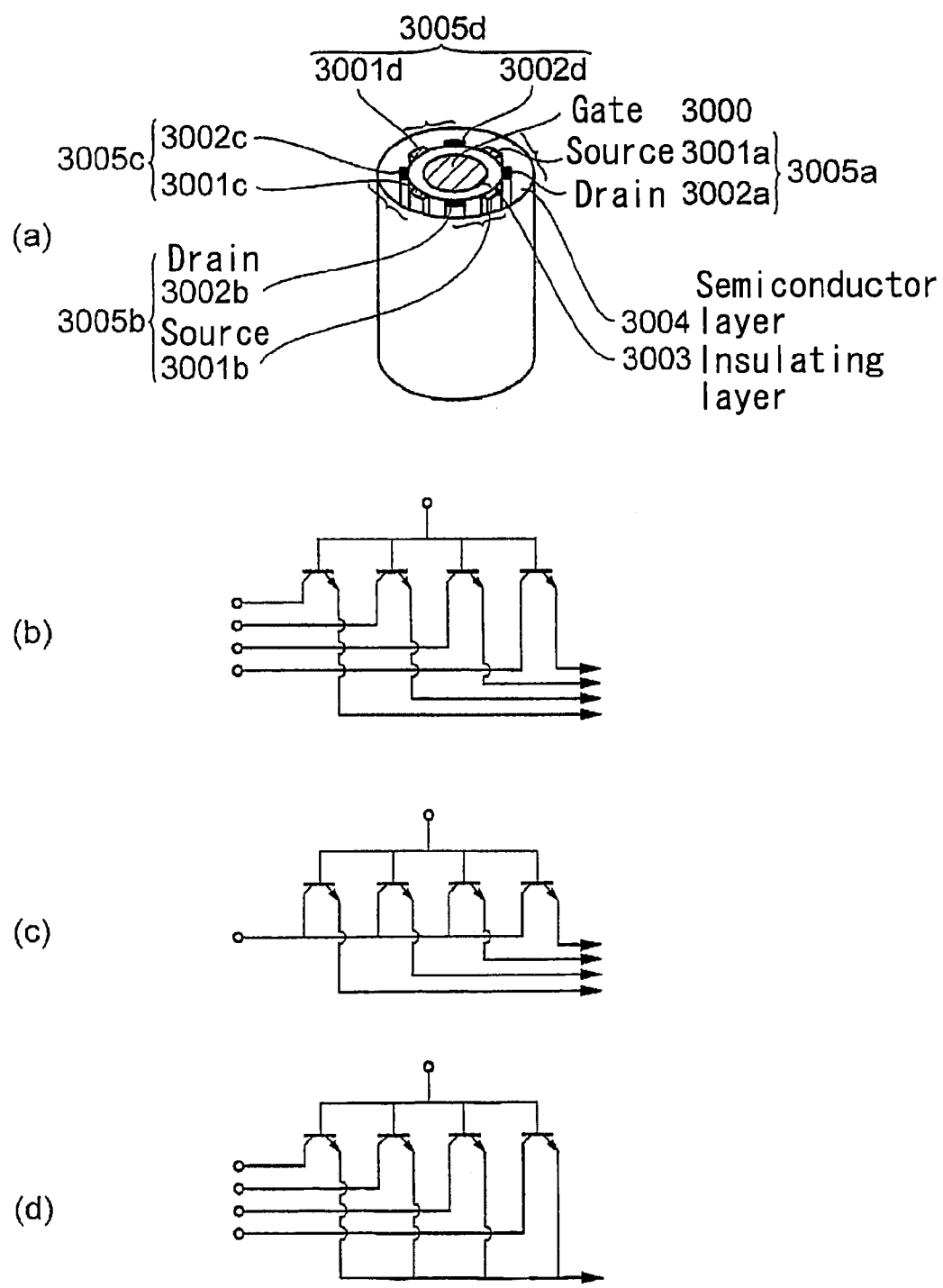
FIG. 17 is a view showing a preferred embodiment 14.

FIG. 17 shows the example 14.

As shown in FIG. 17(a), the line element of this example has a center electrode 3000 at the center, on the outer circumference of the center electrode 3000, an insulating layer 3004 is formed, and on the outer circumference of the insulating layer 3004, a semiconductor layer 3003 is formed in which plural pairs 3005a, 3005b, 3005c and 3005d of source areas 3001a, 3001b, 3001c, 3001d and drain areas 3002a, 3002b, 3002c, 3002d are formed.

An equivalent circuit of the line element shown in FIG. 17(a) is shown in FIG. 17(b).

In this example, the center electrode 3000 is a gate electrode. Also, the center electrode 3000 is a common electrode. That is, it is the common electrode for 4 source/drain pairs 3005a, 3005b, 3005c and 3005d. By providing only a single gate electrode, 4 pairs of MOSFET can be formed in a single linear body. Of course, the number of the source/drain pairs is not limited to 4 but 2 or more plural pairs may be formed.

FIG. 17(c) is an equivalent circuit when the sources are connected with a common line. It is only necessary to connect sources with a line on an upper or lower end face of the linear body. Also, by forming an exposed portion at a middle portion of the linear body in the longitudinal direction, connection can be made from there.

FIG. 17(d) is an equivalent circuit when the drains are connected with a common line. Connection between drains can be made in the same way as that of the sources.

The element in this example can be produced by the above injection mold, for example.

Example 15

Figure 18:
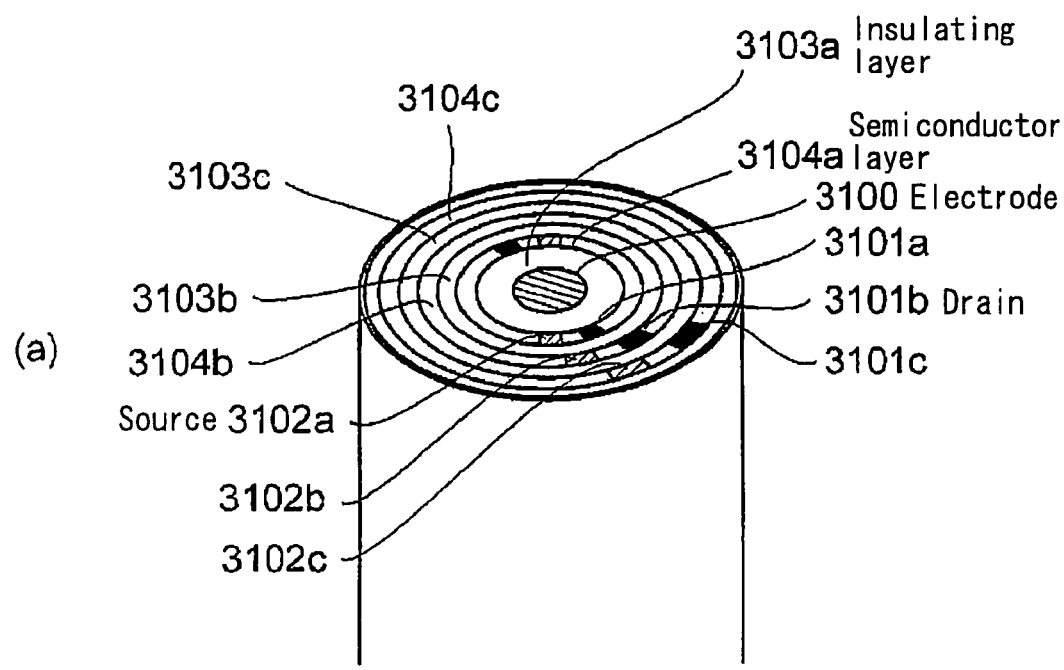
FIG. 18 is a view showing a preferred embodiment 15.
Figure 18:
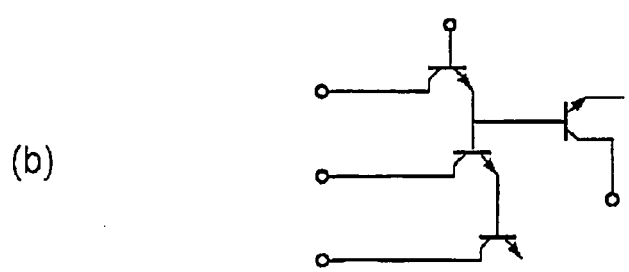
Figure 18:
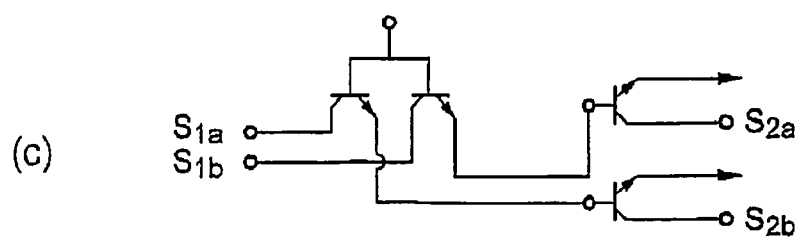

FIG. 18 shows the example 15.

As shown in FIG. 18(a), the line element of this example has an electrode 3100 at the center, on the outer circumference of the center electrode 3100, an insulating layer 3103a is formed, and on the outer circumference of the insulating layer 3103a, semiconductor layers 3104b, 3104c and insulating layers 3103b, 3103c are formed alternately in plural, and on each of the semiconductor layer on the second layer and outward, one pair or more of a source area 3102b and a drain area 3101b, while a drain area 310a or a drain electrode in the inner semiconductor layer is positioned between the source area 3102b and the drain area 3101b.

FIG. 18(b) shows an equivalent circuit of the element of FIG. 17(a).

In this example, a drain output in the inner circumference is an input of the semiconductor layer on the outer circumference. Thus, a single gate (center electrode 3100) is capable of parallel processing of a number of signals.

FIG. 18(c) is an equivalent circuit in the case where a plurality of MOSFET is formed in a single semiconductor layer. In this way, according to this example, an integrated circuit with extremely high integration can be formed.

Example 16

Figure 19:
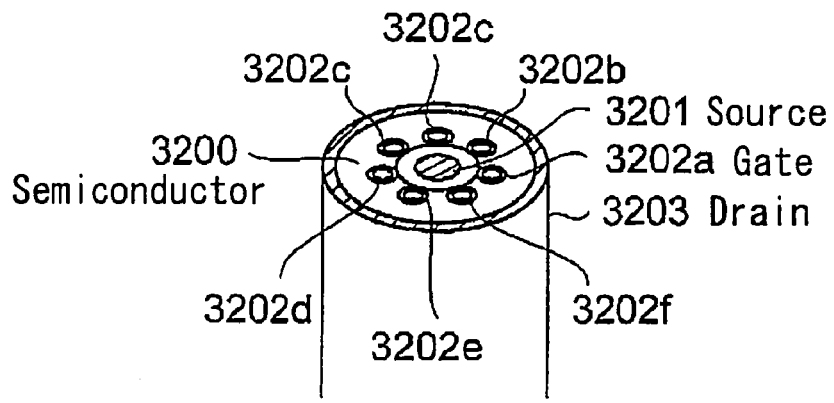
FIG. 19 is a view showing a preferred embodiment 16.
Figure 19:
Figure 19:
Figure 19:
Figure 19:
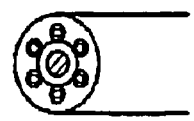

FIG. 19 shows the example 16.

In this example, a source area 3201 is provided at the center of the semiconductor layer 3200, a plurality of gate electrodes 3202a, 3202b, 3202c, 3202d, 3202e, 3202f arranged intermittently in the circumferential direction are provided through the semiconductor layer around the source area 3201, and a drain area 3203 is provided on the outer circumference of the semiconductor layer 3200.

A manufacture example of the element of this example is shown in FIG. 19, 1 to 5.

First, a line 3201 for source is prepared. As a line for source, gold, silver or other electrically conductive materials can be used, for example.

Then, the surface of the line 3201 for source is coated by the semiconductor layer by a dip method or the like. As a semiconductor, above-mentioned organic semiconductor is preferable.

In the meantime, a plurality of gate electrodes are prepared, and these gate electrodes are arranged on a plane with a desired interval.

After coating the semiconductor layer, at the time when the semiconductor solid layer is half-dried, it is made to roll on the gate electrode as shown in 3. By this, an intermediate body in which the gate electrodes are arranged circumferentially with a desired interval is formed on the surface of the semiconductor layer.

Then, on the surface of the intermediate body on which the gate electrodes are formed, a semiconductor liquid layer is formed by the dip method or the like.

Then, a drain electrode made of gold or the like is formed on the outer circumference of the semiconductor layer by deposition method or the like.

Example 17

Heat treatment is conducted to the line element with various purposes. Also, dopant is implanted into the line element.

Figure 20:
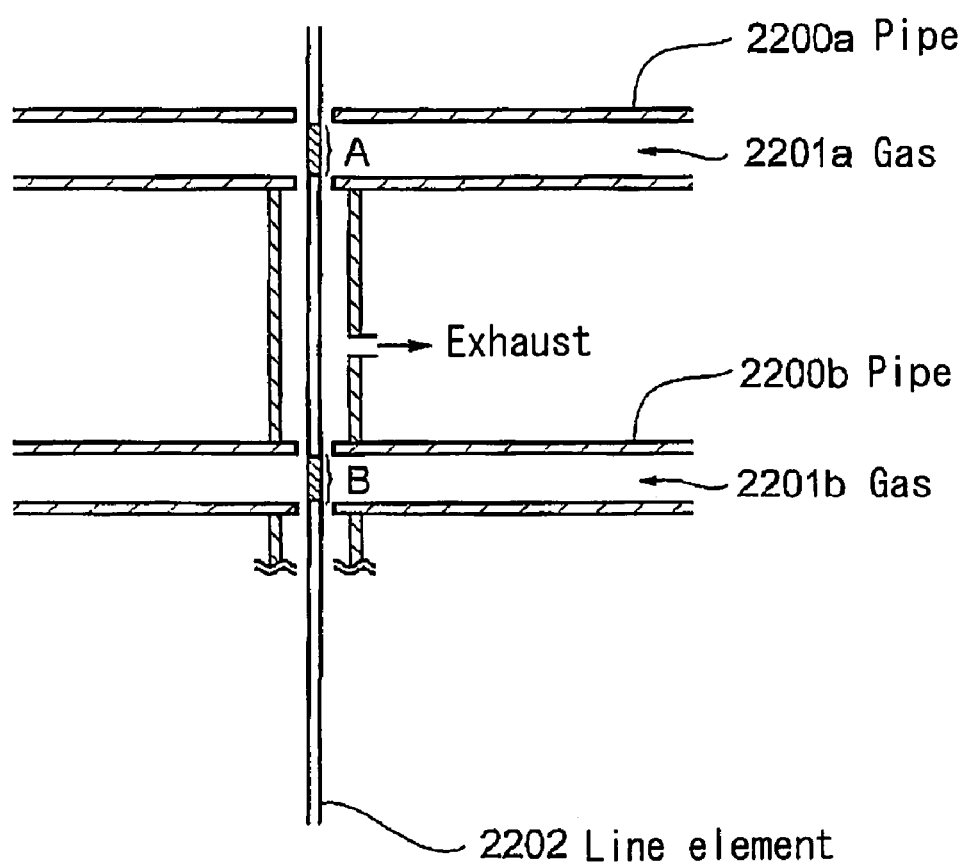
FIG. 20 is a view showing a preferred embodiment 17.

FIG. 20 is a view showing a device capable of heat treatment at different temperatures or implantation of different dopant.

In this device, a plurality of pipes 2200a, 2200b are arranged in the multi-stage state, and the line element 2202 is fed penetrating the pipes 2200a, 2200b arranged in the multi-stage state.

If an oxide film is to be formed at an A portion of the line element 2202, for example, feeding of the line element 2002 is stopped and a heated oxidizing gas is introduced to the pipe 2200a. Or, if a gas containing a dopant is introduced, the dopant can be implanted into the A portion. Thus, the line element having different cross-sectional areas can be formed in the longitudinal direction.

Also, when the entire line element 2202 is to be thermally processed, it is only necessary to introduce a heated inactive gas to the pipe 2200*a* while keeping feeding of the line element. For example, the dopant can be used for heat processing for diffusion of the dopant after implantation.

Also, the same gas may be introduced into the pipe 2200*a* and the pipe 2200*b* or different gases can be fed. Even if the same gas is to be introduced, gas temperatures can be different or the same.

It is preferable that a space between the pipe 2200*a* and the pipe 2200*b* is sealed, and exhaust can be done from the sealed space. By this, leakage of a leak gas to the outside can be prevented.

Diborane gas, for example, may be introduced as a gas. In this case, since the line element has passed the liquid phase, doping, for example, is possible. That is, doping can be done with a simple device such as the one shown in FIG. 20.

As heat treatment to the line element, heat treatment with the purpose of obtaining optimum junction or crystallinity, heat treatment for diffusion of dopant and other heat treatments are exemplified.

INDUSTRIAL APPLICABILITY

A line element which is not limited by shape but has plasticity or flexibility and is capable of forming various devices in any shape and its manufacturing method can be provided.

The invention claimed is:

1. A method for manufacturing a line element characterized in that materials forming areas forming a circuit device are melted, fused or gelled and all said materials are injected through a die which has injection holes corresponding to the areas of the circuit device and in communication with respective raw material containers.

2. A method for manufacturing a line element in claim 1, wherein a part of said areas is formed by an electrically conductive polymer.

3. A method for manufacturing a line element in claim 1, wherein drawing is further applied.

4. A method for manufacturing a line element in claim 1, wherein expansion is further applied.

5. A method for manufacturing a line element in claim 3, wherein after said drawing, expansion is further applied.

6. A method for manufacturing a line element in claim 5, wherein after said expansion, formation is conducted into the ring state.

7. A method for manufacturing a line element laminated in multiple layers from the center to the outside in claim 1, wherein a center layer is extruded to form a filament state to have a primary filament and then, while running said primary filament, a material of an outer layer is injected to the surface to form outer layers sequentially.

8. A method for forming a line element in claim 7, wherein at extrusion of the electrically conductive polymer, a difference between a running speed and an injection speed is set at 20m/ sec or more.

9. A method for manufacturing a line element in claim 1, wherein a plurality of said materials are injected through a plurality of said holes simultaneously.

10. A method for manufacturing a line element in claim 9, wherein all said materials are injected through said holes simultaneously.

* * * * *